(12) United States Patent
Shen (10) Patent No.: US 7,960,741 B2
(45) Date of Patent: Jun. 14, 2011

(54) LIGHT EMITTING DIODE WITH PHOSPHOR MATERIAL AND REFLECTIVE LAYER AND METHOD FOR MAKING SAME

(76) Inventor: Yu-Nung Shen, Taipei (TW)

( * ) Notice: Subject to any disclaimer, the term of this patent is extended or adjusted under 35 U.S.C. 154(b) by 445 days.

(21) Appl. No.: 12/039,649

(22) Filed: Feb. 28, 2008

(65) Prior Publication Data

US 2008/0210967 A1 Sep. 4, 2008

(30) Foreign Application Priority Data

Mar. 2, 2007 (TW) .............................. 96107291 A (51) Int. Cl.
*H01L 27/15* (2006.01)
(52) U.S. Cl. ...................... 257/82; 257/98; 257/E33.072

(58) Field of Classification Search .................... 257/98, 257/458
See application file for complete search history.

(56) References Cited

U.S. PATENT DOCUMENTS
2007/0194709 A1* 8/2007 Kato et al. .................... 313/512
* cited by examiner

*Primary Examiner* — Marcos D. Pizarro
*Assistant Examiner* — Eva Yan Montalvo
(74) *Attorney, Agent, or Firm* — Houston Eliseeva LLP (57) ABSTRACT

A light emitting diode includes: a first semiconductor layer; a second semiconductor layer formed on the first semiconductor layer; a light-converting pattern of a phosphor material formed on the second semiconductor layer; and a reflective layer of a metallic material formed on the second semiconductor layer and enclosing the light-converting pattern.

7 Claims, 10 Drawing Sheets

LIGHT EMITTING DIODE WITH PHOSPHOR MATERIAL AND REFLECTIVE LAYER AND METHOD FOR MAKING SAME

CROSS-REFERENCE TO RELATED APPLICATION

This application claims priority of Taiwanese application no. 096107291, filed on Mar. 2, 2007.

BACKGROUND OF THE INVENTION

1. Field of the Invention

This invention relates to a light emitting diode and a method for making the same, more particularly to a light emitting diode having first and second semiconductor layers and a light-converting pattern formed on one of the first and second semiconductor layers.

2. Description of the Related Art

Light emitting devices, such as light emitting diodes and laser emitting diodes, have recently been applied to displays and various light sources. Hence, there is a need to enhance the brightness of the light emitting devices.

SUMMARY OF THE INVENTION

An object of the present invention is to provide a light emitting diode that has an improved brightness.

Another object of the present invention is to provide a method for making the light emitting diode.

According to one aspect of this invention, a light emitting diode comprises: a first semiconductor layer; a second semiconductor layer formed on the first semiconductor layer; a light-converting pattern of a phosphor material formed on the second semiconductor layer; and a reflective layer of a metallic material formed on the second semiconductor layer and enclosing the light-converting pattern.

According to another aspect of this invention, a method for making light emitting diodes comprises: (a) preparing a semiconductor wafer including a plurality of spaced apart diode-forming units, each of which has a first semiconductor layer and a second semiconductor layer formed on the first semiconductor layer, the first and second semiconductor layers having first and second electrode pads, respectively, one of the first and second semiconductor layers being an n-type semiconductor, the other of the first and second semiconductor layers being a p-type semiconductor; (b) forming a light-converting pattern of a phosphor material on the second semiconductor layer of each of the diode-forming units; (c) forming an insulator layer on the first and second semiconductor layers of each of the diode-forming units such that the first and second electrode pads of the first and second semiconductor layers and the light-converting pattern are not covered by the insulator layer; and (d) forming first and second conductive bumps connected to the first and second electrode pads of the first and second semiconductor layers of each of the diode-forming units, respectively.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Before the present invention is described in greater detail with reference to the accompanying preferred embodiments, it should be noted herein that like elements are denoted by the same reference numerals throughout the disclosure.

Figure 1:
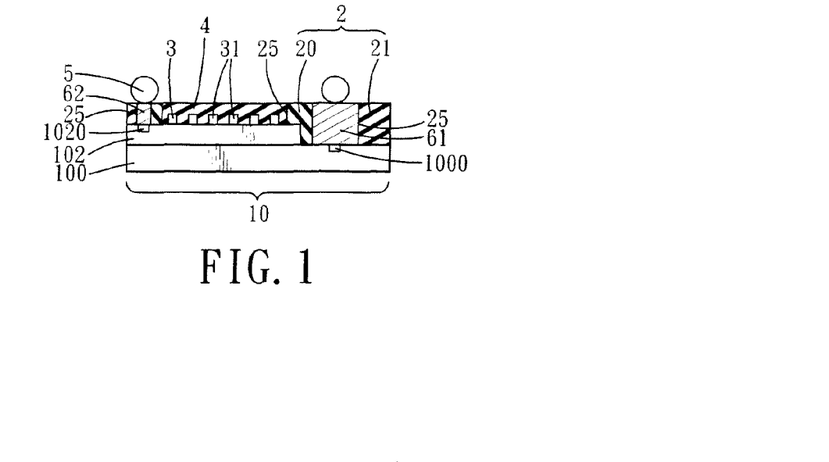
FIG. 1 is a schematic partly sectional view of the first preferred embodiment of a light emitting diode according to this invention.
Figure 2:
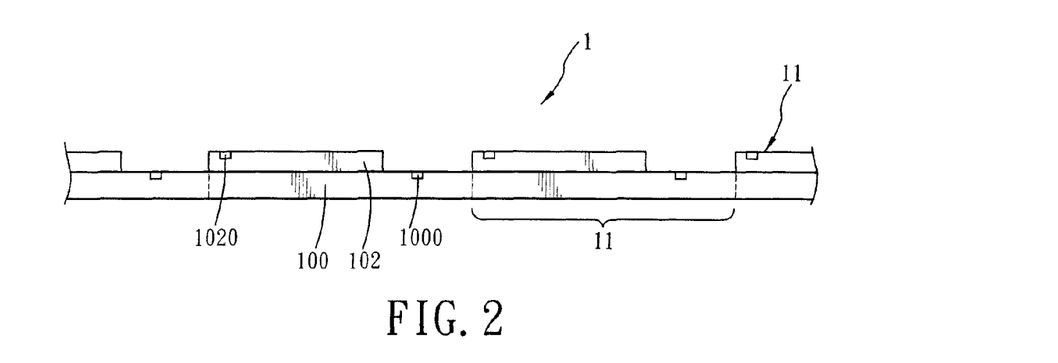
FIGS. 2 to 9 are fragmentary schematic views to illustrate consecutive steps of a method for making the light emitting diode of the first preferred embodiment.
Figure 3:
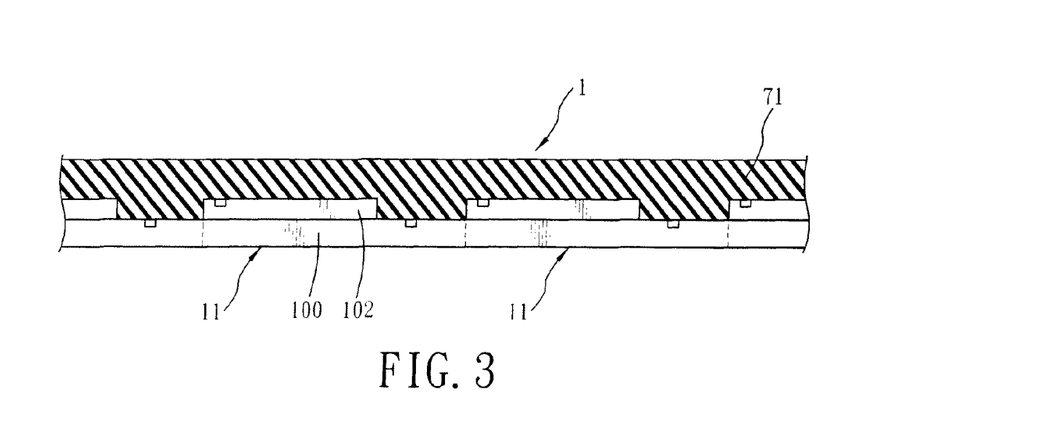
Figure 4:
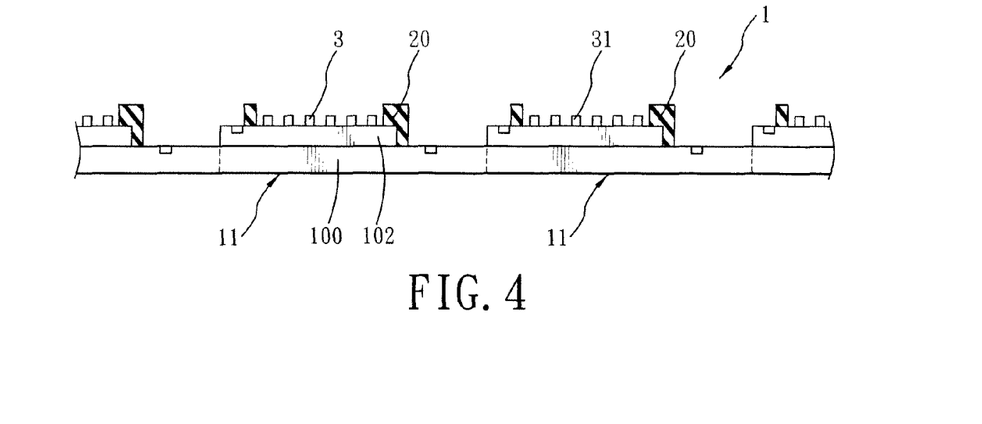
Figure 5:
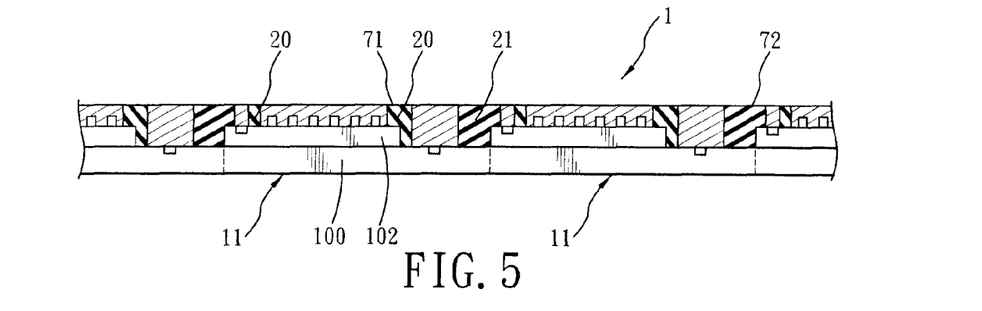

FIG. 1 illustrates the first preferred embodiment of a light emitting diode 10 according to the present invention. The light emitting diode 10 includes: a first semiconductor layer 100 of an n-type semiconductor having a first electrode pad 1000; a second semiconductor layer 102 of a p-type semiconductor formed on the first semiconductor layer 100 and having a second electrode pad 1020; a light-converting pattern 3 of a phosphor material formed on the second semiconductor layer 102; a reflective layer 4 of a metallic material formed on the second semiconductor layer 102 and enclosing the light-converting pattern 3, and an insulator layer 2 of a photoresist formed on the first and second semiconductor layers 100, 102 and formed with holes 25 for access to the first and second electrode pads 1000, 1020 and the reflective layer 4. In this embodiment, the insulator layer 2 includes a first insulator pattern 20 of a first photoresist formed on the first and second semiconductor layers 100, 102, and a second insulator pattern 21 of a second photoresist formed on the second semiconductor layer 102.

The light emitting diode 10 further includes first and second conductive bodies 61, 62, each of which fills a respective one of the holes 25 in the insulator layer 2 and each of which is connected to a respective one of the first and second electrode pads 1000, 1020, and first and second conductive bumps 5, each of which is disposed at a periphery of a respective one of the holes 25 in the insulator layer 2 and each of which is connected to a respective one of the first and second electrode pads 1000, 1020 through a respective one of the first and second conductive bodies 61, 62.

In this embodiment, the light-converting pattern 3 has a plurality of spaced apart particulate phosphor bodies 31 formed on the second semiconductor layer 102. The phosphor material preferably contains a luminance-enhancing material selected from one of $CrTiO_2$ and $CrO_2$ so as to enhance the brightness of the light emitting diode 10.

FIGS. 2 to 9 illustrate consecutive steps of a method for making the light emitting diode 10 of the first preferred embodiment. The method includes the steps of: (a) preparing a semiconductor wafer 1 including a plurality of spaced apart diode-forming units 11, each of which has the first semiconductor layer 100 and the second semiconductor layer 102 formed on the first semiconductor layer 100 (see FIG. 2); (b) forming the light-converting pattern 3 on the second semiconductor layer 102 of each of the diode-forming units 11 (see FIG. 4); (c) forming the insulator layer 2 on the first and second semiconductor layers 100, 102 of each of the diode-forming units 11 such that the first and second electrode pads 1000, 1020 of the first and second semiconductor layers 100, 102 and the light-converting pattern 3 are not covered by the insulator layer 2 (see FIG. 6); and (d) forming the first and second conductive bumps 5 connected to the first and second electrode pads 1000, 1020 of the first and second semiconductor layers 100, 102 of each of the diode-forming units 11, respectively (see FIG. 9).

In this embodiment, the method further includes forming a metallic material 4' on the first and second semiconductor layers 100, 102 of each of the diode-forming units 11 (see FIG. 7) and polishing the metallic material 4' until the insulator layer 2 is exposed (see FIG. 8) so that the metallic material 4' is divided by the insulator layer 2 into a first portion that defines the metal layer 4, a second portion that is isolated from the first portion and that defines the first conductive body 61, and a third portion that is isolated from the first and second portions and that defines the second conductive body 62.

Figure 6:
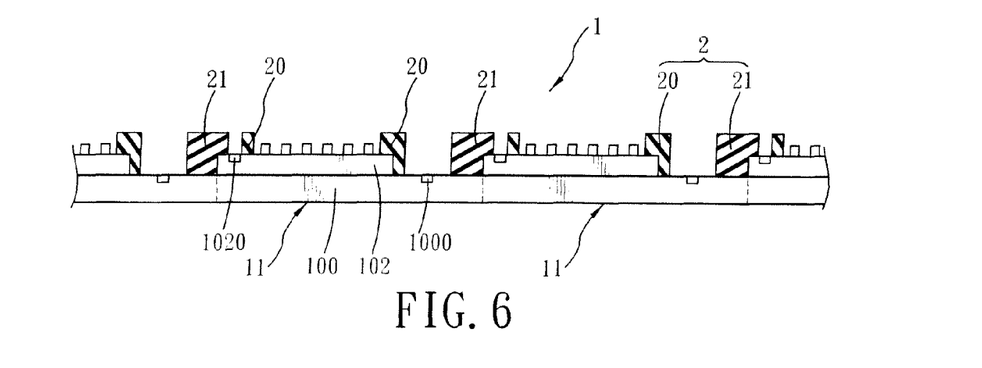
Figure 7:
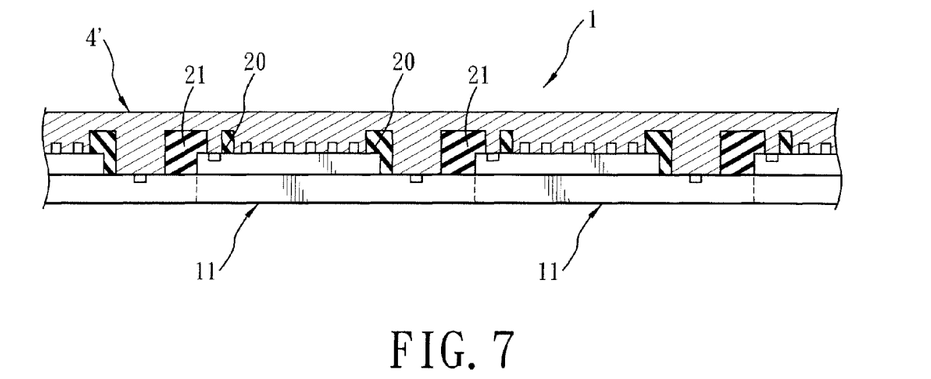
Figure 8:
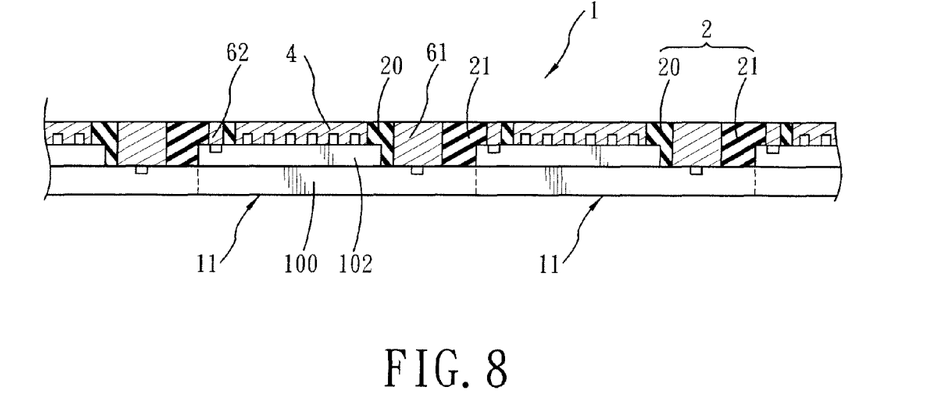
Figure 9:
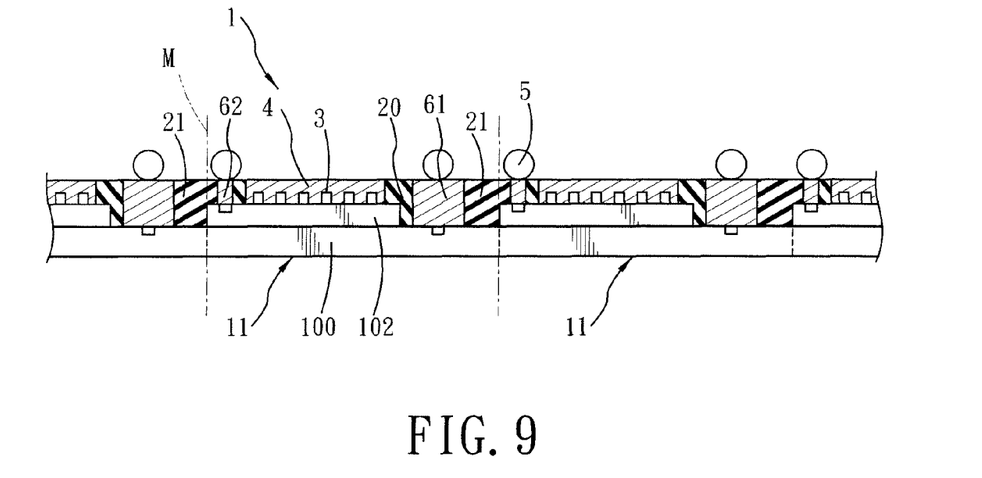

In this embodiment, formation of the insulator layer 2 in step (c) is conducted by forming a first insulator material 71 to cover exposed portions of the first and second semiconductor layers 100, 102 of each of the diode units 11 prior to step (b) (see FIG. 3), patterning the first insulator material 71 to form the first insulator pattern 20 that exposes the first and second electrode pads 1000, 1020 and the light-converting pattern 3 (see FIG. 4), forming a second insulator material 72 to cover the first insulator pattern 20, the first and second electrode pads 1000, 1020, the light-converting pattern 3, and exposed portions of the first and second semiconductor layers 100, 102 after step (b) (see FIG. 5), and patterning the second insulator material 72 to form the second insulator pattern 21 that exposes the first and second electrode pads 1000, 1020 and the light-converting pattern 3 (see FIG. 6).

After formation of the metal layer 4 and the first and second conductive bodies 61, 62, the semiconductor wafer 1 is diced along cutting lines (M) that separate the diode-forming units 11 (see FIG. 9) so as to form bare chips of the light emitting diodes 10.

Figure 10:
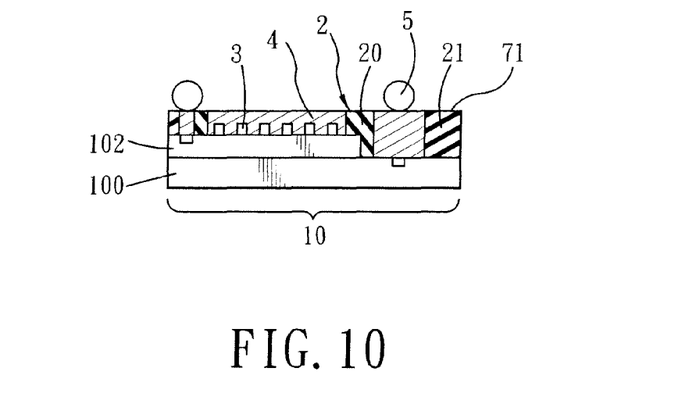
FIG. 10 is a schematic partly sectional view of the second preferred embodiment of the light emitting diode according to this invention.

FIG. 10 illustrates the second preferred embodiment of the light emitting diode 10 according to this invention. The second preferred embodiment differs from the previous embodiment in that the insulator layer 2, i.e., the first and second insulator patterns 20, 21, is formed solely from the first insulator material 71.

Figure 11:
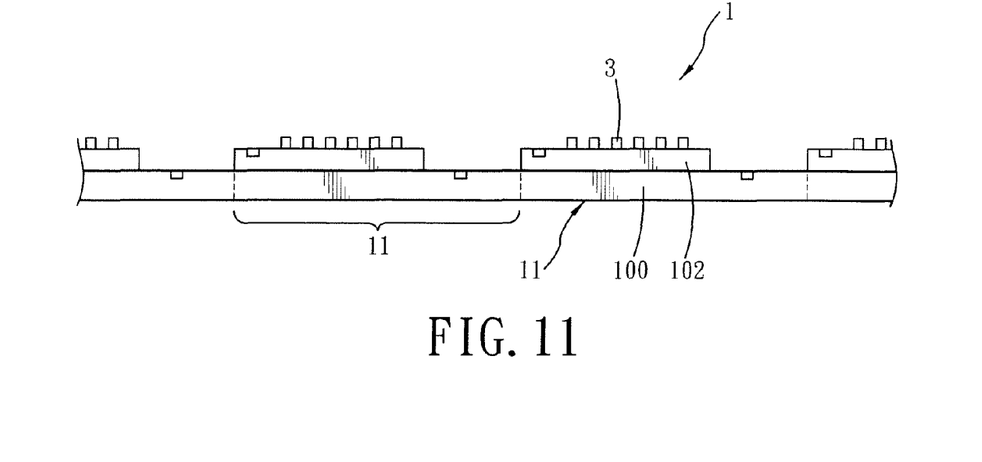
FIGS. 11 to 13 are fragmentary schematic views to illustrate consecutive steps of a method for making the light emitting diode of the second preferred embodiment.
Figure 12:
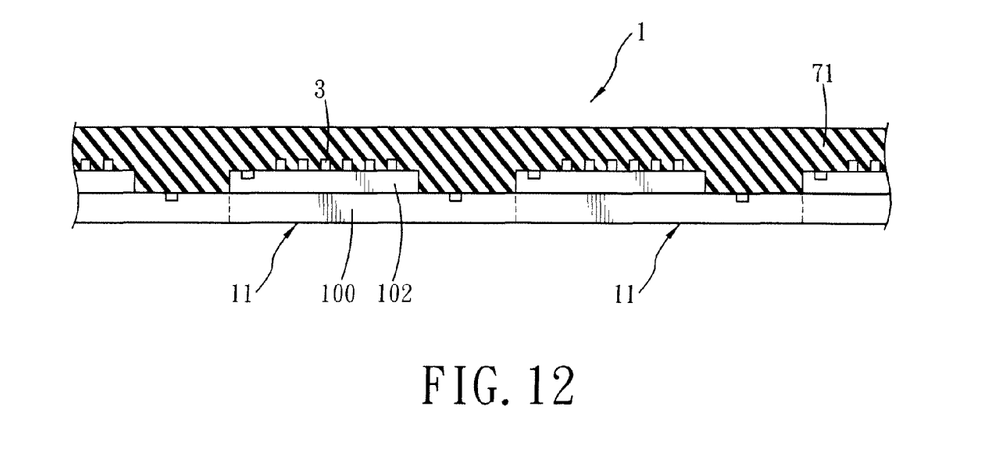
Figure 13:
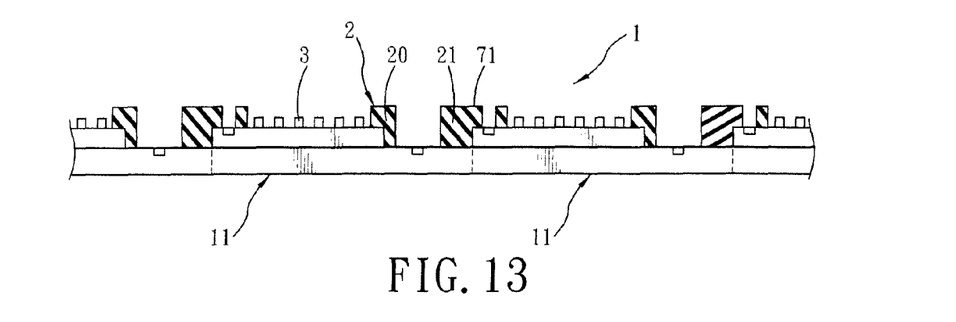

FIGS. 11 to 13 illustrate consecutive steps of a method for making the light emitting diode 10 of the second preferred embodiment. The method for making the second preferred embodiment differs from the method for making the first preferred embodiment in that the insulator layer 2 is formed directly by patterning the first insulator material 71 (see FIGS. 12 and 13) into the first and second insulator patterns 20, 21, thereby dispensing with the second insulator material 72. The subsequent steps of the method for making the second preferred embodiment are similar to those of the method for making the first preferred embodiment.

Figure 14:
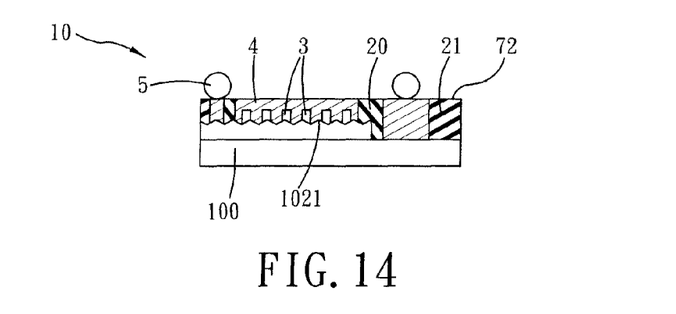
FIG. 14 is a schematic partly sectional view of the third preferred embodiment of the light emitting diode according to this invention.

FIG. 14 illustrates the third preferred embodiment of the light emitting diode 10 according to this invention. The third preferred embodiment differs from the first embodiment in that the second semiconductor layer 102 has a roughened surface 1021 and that the light-converting pattern 3 is formed on the roughened surface 1021 of the second semiconductor layer 102.

Figure 15:
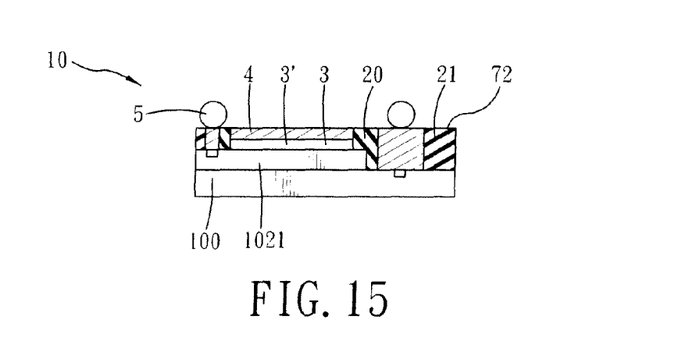
FIG. 15 is a schematic partly sectional view of the fourth preferred embodiment of the light emitting diode according to this invention.
Figure 16:
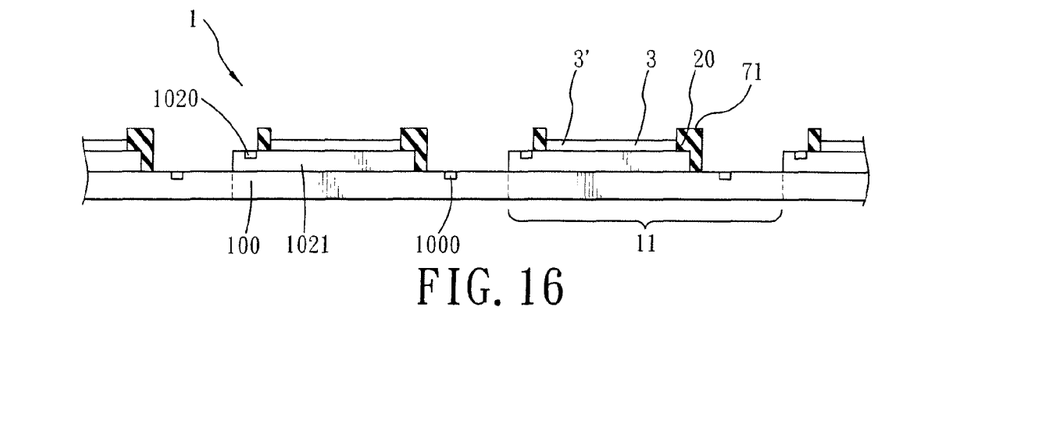
FIGS. 16 to 19 are fragmentary schematic views to illustrate consecutive steps of a method for making the light emitting diode of the fourth preferred embodiment.
Figure 17:
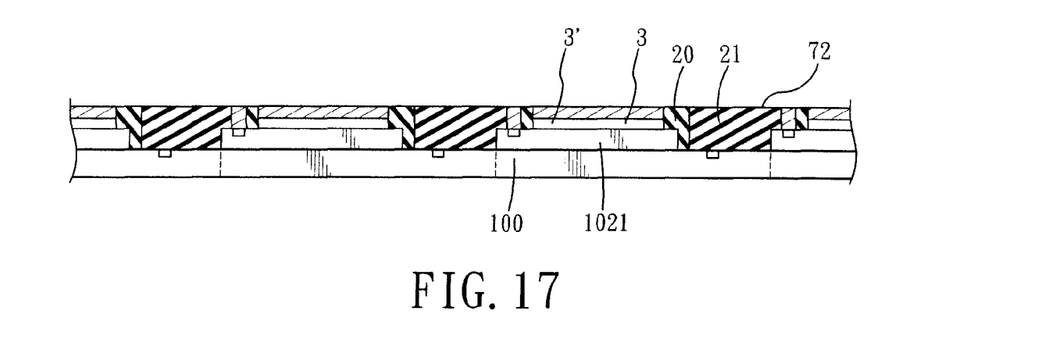
Figure 18:
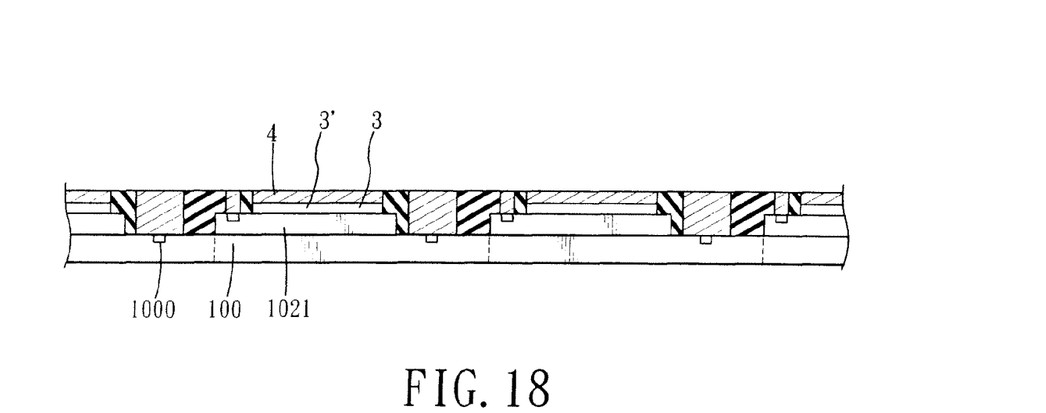
Figure 19:
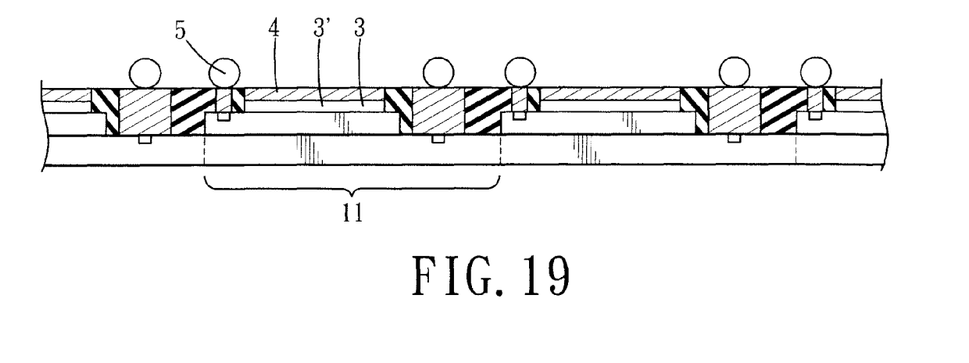

FIG. 15 illustrates the fourth preferred embodiment of the light emitting diode 10 according to this invention. The fourth preferred embodiment differs from the first embodiment in that the light-converting pattern 3 is in the form of a continuous phosphor layer 3' on the second semiconductor layer 102.

FIGS. 16 to 19 illustrate consecutive steps of a method for making the light emitting diode 10 of the fourth preferred embodiment. The method for making the fourth preferred embodiment differs from the method for making the first preferred embodiment in that the light-converting pattern 3 is formed by applying the continuous phosphor layer 3' on the second semiconductor layer 102 (see FIG. 16).

Figure 20:
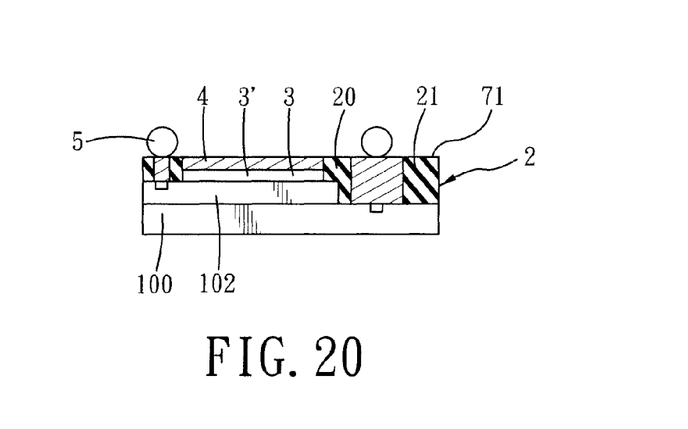
FIG. 20 is a schematic partly sectional view of the fifth preferred embodiment of the light emitting diode according to this invention.
Figure 21:
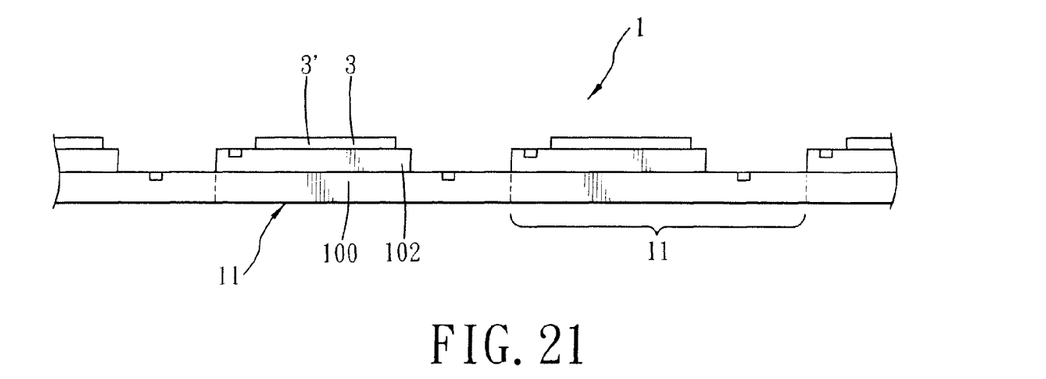
FIGS. 21 to 24 are fragmentary schematic views to illustrate consecutive steps of a method for making the light emitting diode of the fifth preferred embodiment.
Figure 22:
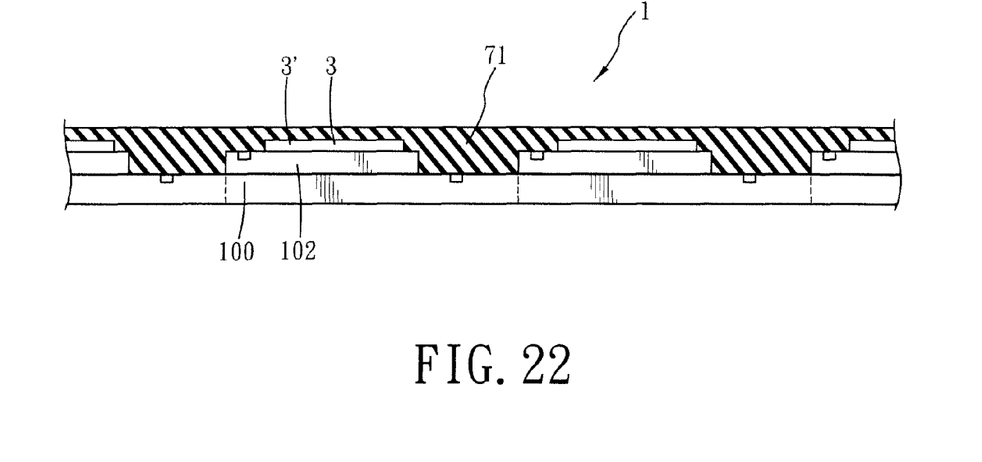
Figure 23:
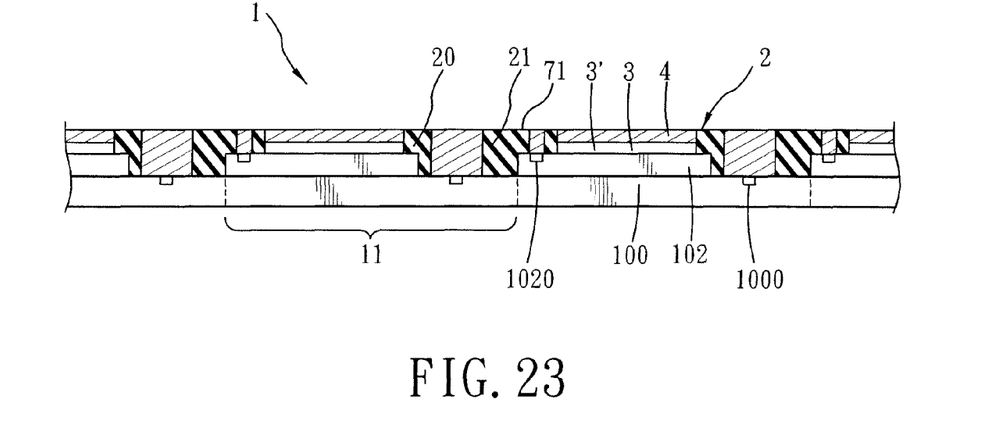
Figure 24:
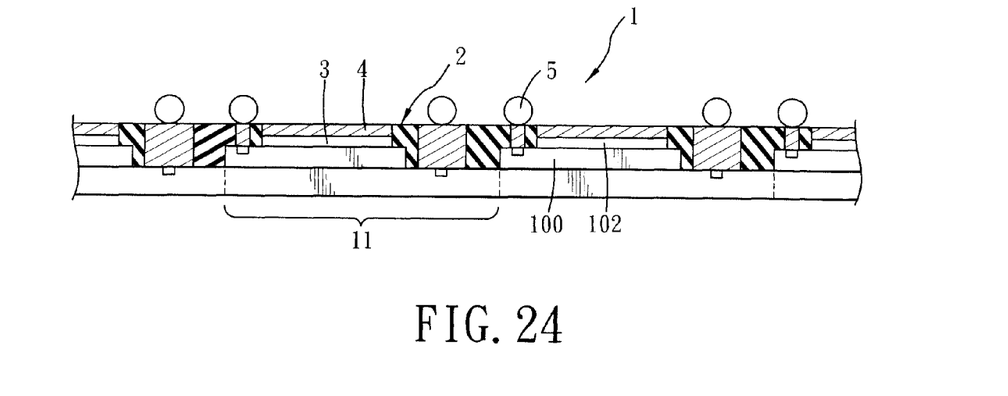

FIG. 20 illustrates the fifth preferred embodiment of the light emitting diode 10 according to this invention. The fifth preferred embodiment differs from the second embodiment in that the light-converting pattern 3 is in the form of a continuous phosphor layer 3' on the second semiconductor layer 102.

FIGS. 21 to 24 illustrate consecutive steps of a method for making the light emitting diode 10 of the fifth preferred embodiment. The method for making the fifth preferred embodiment differs from the method for making the second preferred embodiment in that the light-converting pattern 3 is formed by applying the continuous phosphor layer 3' on the second semiconductor layer 102 (see FIG. 21).

Figure 25:
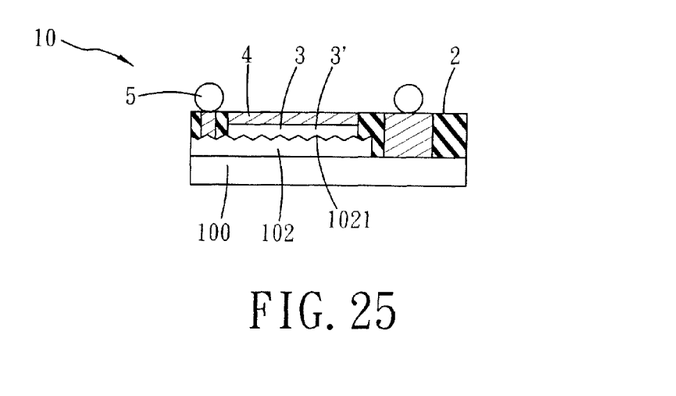
FIG. 25 is a schematic partly sectional view of the sixth preferred embodiment of the light emitting diode according to this invention.

FIG. 25 illustrates the sixth preferred embodiment of the light emitting diode 10 according to this invention. The sixth preferred embodiment differs from the fifth embodiment in that the second semiconductor layer 102 has a roughened surface 1021 and that the light-converting pattern 3 is formed on the roughened surface 1021 of the second semiconductor layer 102.

With the inclusion of the light-converting pattern 3 in the light emitting diode 10 of this invention, the brightness of the light emitting diode 10 can be enhanced.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A light emitting diode comprising:
a first semiconductor layer having a first electrode pad;
a second semiconductor layer formed on said first semiconductor layer and having a second electrode pad;
a light-converting pattern of a phosphor material formed on said second semiconductor layer;

a reflective layer of a metallic material formed on said second semiconductor layer and enclosing said light-converting pattern; and an insulator layer formed on said first and second semiconductor layers and formed with holes for access to said first and second electrode pads and said reflective layer.

2. The light emitting diode of claim 1, wherein said first semiconductor layer is an n-type semiconductor, and said second semiconductor layer is a p-type semiconductor.

3. The light emitting diode of claim 1, further comprising first and second conductive bodies, each of which fills a respective one of said holes in said insulator layer and each of which is connected to a respective one of said first and second electrode pads.

4. The light emitting diode of claim 3, further comprising first and second conductive bumps, each of which is disposed at a periphery of a respective one of said holes in said insulator layer and each of which is connected to a respective one of said first and second electrode pads.

5. The light emitting diode of claim 1, wherein said light-converting pattern has a plurality of spaced apart particulate phosphor bodies formed on said second semiconductor layer.

6. The light emitting diode of claim 1, wherein said light-converting pattern is in the form of a continuous phosphor layer on said second semiconductor layer.

7. The light emitting diode of claim 1, wherein said second semiconductor layer has a roughened surface, said light-converting pattern being formed on said roughened surface of said second semiconductor layer.

* * * * *